United States Patent
Formicone

(10) Patent No.: US 8,350,271 B2
(45) Date of Patent: Jan. 8, 2013

(54) TRANSISTOR INCLUDING SHALLOW TRENCH AND ELECTRICALLY CONDUCTIVE SUBSTRATE FOR IMPROVED RF GROUNDING

(75) Inventor: Gabriele F. Formicone, Chandler, AZ (US)

(73) Assignee: Integra Technologies, Inc., El Segundo, CA (US)

(*) Notice: Subject to any disclaimer, the term of this patent is extended or adjusted under 35 U.S.C. 154(b) by 199 days.

(21) Appl. No.: 12/952,129

(22) Filed: Nov. 22, 2010

(65) Prior Publication Data
US 2012/0126243 A1    May 24, 2012

(51) Int. Cl.
*H01L 31/0312* (2006.01)

(52) U.S. Cl. .............. 257/77; 257/76; 438/667

(58) Field of Classification Search ............. 257/76, 257/77, 192, E29.246; 438/667
See application file for complete search history.

(56) References Cited

U.S. PATENT DOCUMENTS

| | | | |
|---|---|---|---|
| 5,404,373 A * | 4/1995 | Cheng | 372/50.124 |
| 5,698,462 A * | 12/1997 | Sasaki | 438/167 |
| 7,291,872 B2 * | 11/2007 | Hikita et al. | 257/192 |
| 2006/0289894 A1 * | 12/2006 | Murata et al. | 257/192 |
| 2010/0181640 A1 * | 7/2010 | Shiromoto et al. | 257/506 |

* cited by examiner

Primary Examiner — Phuc Dang
(74) Attorney, Agent, or Firm — Fountain Law Group, Inc.; George L. Fountain

(57) ABSTRACT

Disclosed is an RF power FET or HEMT including an electrically-conductive substrate, a grounding metallization layer disposed on a bottom surface of the electrically-conductive substrate, an active area comprising at least one cell including source, gate and drain electrodes disposed over a top surface of the electrically-conductive substrate, and an electrically-conductive shallow trench electrically connecting the source electrode to the grounding metallization layer by way of the electrically-conductive substrate. This configuration results in the effective RF ground being very close to the active area of the FET in order to reduce parasitic source inductance and resistance. This results in potentially higher gain, higher saturation point, higher $3^{rd}$-order intercept, more efficient combining of the input RF signal, and more efficient extraction of the output RF signal. Additional benefits include reduced process complexity, such as, reduced need for plated air bridges, via holes formation and plating, front and back lithography alignment.

16 Claims, 10 Drawing Sheets

TRANSISTOR INCLUDING SHALLOW TRENCH AND ELECTRICALLY CONDUCTIVE SUBSTRATE FOR IMPROVED RF GROUNDING

FIELD

This invention relates generally to radio frequency (RF) and microwave devices, and in particular, to an RF power transistor comprising an electrically-conductive shallow trench and an electrically conductive substrate for improved RF grounding of at least one terminal (e.g., the source) of the transistor, such as a field effect transistor (FET) or high electron mobility transistor (HEMT).

BACKGROUND

Typical radio frequency (RF) power transistors are based on field effect transistor (FET) technology, such as a high electron mobility transistor (HEMT), although some RF power transistors are based on bipolar junction technology. In the case of FET or HEMT technology, a typical RF power transistor includes a plurality of cells connected in parallel. Each cell includes a source, gate, and drain. The cells are typically formed on top of one or more epitaxial layers grown above a non-electrically-conductive or relatively high resistivity substrate (e.g., 5000 to 10,000 ohm-cm).

The typical RF power FET or HEMT further includes an input signal metallization pad disposed over the epitaxial layers. The input signal metallization pad is electrically connected to the gates of the cells. Similarly, the typical RF power FET or HEMT also includes an output signal metallization pad disposed over the high resistivity substrate. In a similar manner, the output signal metallization pad is electrically connected to the drains of the cells.

The sources of the cells are electrically connected to a ground terminal, which, in many cases, is at a metallization layer disposed on the bottom surface of the high resistivity substrate. In order to effectuate the grounding of the sources, metalized via holes are formed through the one or more epitaxial layers and the high resistivity substrate to electrically connect the sources to the grounded bottom metallization layer of the substrate, respectively.

There are many drawbacks associated with the typical RF power transistor, and in particular, to the grounding of the source of each cell of the transistor. More specifically, each metalized via hole used for electrically connecting a corresponding source to the grounded metallization layer on the bottom of the high resistivity substrate has an inherent resistance and inductance. The resistance and inductance are directly related to the length of the metalized via hole, and inversely related to the diameter of the metalized via hole.

Such resistance produces RF losses through the metalized via holes, which results in an effective lower gain for the transistor, as well as a lower saturation point, lower $3^{rd}$-order intercept, higher output harmonics, and other adverse effects. Moreover, the inductances of the metalized via holes lowers the high frequency performance of the transistor. These adverse effects also reduce the effectiveness of the input RF signal combining as well as the output RF power signal extraction. Accordingly, it is generally desirable to reduce the resistance and inductance associated with the RF grounding of the sources of the RF power transistor.

SUMMARY

An aspect of the disclosure relates to a transistor. The transistor comprises an electrically-conductive substrate, a grounding metallization layer disposed on a bottom surface of the electrically-conductive substrate, a first transistor electrode disposed over or above a top surface of the electrically-conductive substrate, and an electrically-conductive shallow trench electrically connecting the first transistor electrode to the grounding metallization layer by way of the electrically-conductive substrate. The use of the electrically-conductive shallow trench and electrically-conductive substrate for RF grounding the transistor electrode improves the performance of the transistor.

The transistor may further comprise one or more stacked epitaxial layers disposed over the electrically-conductive substrate, wherein the first transistor electrode is disposed over the one or more stacked epitaxial layers. The electrically-conductive shallow trench may extend from the first transistor electrode through the one or more stacked epitaxial layers, and to the top surface of the electrically-conductive substrate. Alternatively, if the electrically-conductive substrate has an upper portion with a relatively low electrical conductivity (e.g., an Si epi top layer of a Si substrate), the electrically-conductive shallow trench may extend through the one or more stacked epitaxial layers and the low conductivity portion into the high conductivity portion. The electrically-conductive shallow trench may be situated within or external to an active area of the transistor.

Another aspect of the disclosure relates to a field effect transistor (FET), such as a high electron mobility transistor (HEMT) which is a particular type of FET (also referred to as a heterostructure FET (HFET)). The FET comprises an electrically-conductive substrate; a grounding metallization layer disposed on a bottom surface of the electrically-conductive substrate; an active area comprising at least one cell including source, gate and drain electrodes disposed over or above a top surface of the electrically-conductive substrate; and an electrically-conductive shallow trench electrically connecting the source electrode to the grounding metallization layer by way of the electrically-conductive substrate.

The FET may further comprise one or more stacked epitaxial layers disposed over the electrically-conductive substrate, wherein the source, gate and drain electrodes are disposed over the one or more stacked epitaxial layers. The electrically-conductive shallow trench may extend from the source electrode through the one or more stacked epitaxial layers, and to the top surface of the electrically-conductive substrate. Alternatively, if the electrically-conductive substrate has an upper portion with a relatively low electrical conductivity, the electrically-conductive shallow trench may extend through the one or more stacked epitaxial layers and the low conductivity portion into the high conductivity portion.

The one or more epitaxial layers may comprise a transition layer disposed over the top surface of the electrically-conductive substrate, a buffer layer disposed over the transition layer; and a barrier layer disposed over the buffer layer. Additionally, the one or more epitaxial layers may comprise a cap layer disposed over the barrier layer. For example, the transition layer may comprise GaN/AlN multilayer super lattice; the buffer layer may comprise a GaN buffer layer; the barrier layer may comprise an AlGaN barrier layer; and the cap layer may comprise a GaN cap layer. In other words, the one or more epitaxial layers may be nitride-based.

The electrically-conductive shallow trench may be situated within or external to the active area of the FET. The active area, in turn, may comprise a plurality of cells coupled in parallel. In this regard, at least one pair of adjacent cells may share a source electrode, and at least one other pair of adjacent cells may share a drain electrode. The FET may further comprise an input metallization pad disposed over the electrically-conductive substrate and adapted to receive an input RF signal, wherein the input metallization pad is electrically coupled to the gate electrode of each cell. Additionally, the FET may comprise an output metallization pad also disposed over the electrically-conductive substrate and adapted to produce an output RF signal, wherein the output metallization pad is electrically coupled to the drain electrode of each cell.

Another aspect of the disclosure relates to a method of forming a transistor. The method comprises forming a grounding metallization layer on a bottom surface of an electrically-conductive substrate; forming a transistor electrode over a top surface of the electrically-conductive substrate; and forming an electrically-conductive shallow trench that electrically connects the transistor electrode to the grounding metallization layer by way of the electrically-conductive substrate.

Other aspects, advantages and novel features of the present disclosure will become apparent from the following detailed description when considered in conjunction with the accompanying drawings.

DETAILED DESCRIPTION OF THE EXEMPLARY EMBODIMENTS

Figure 1A:
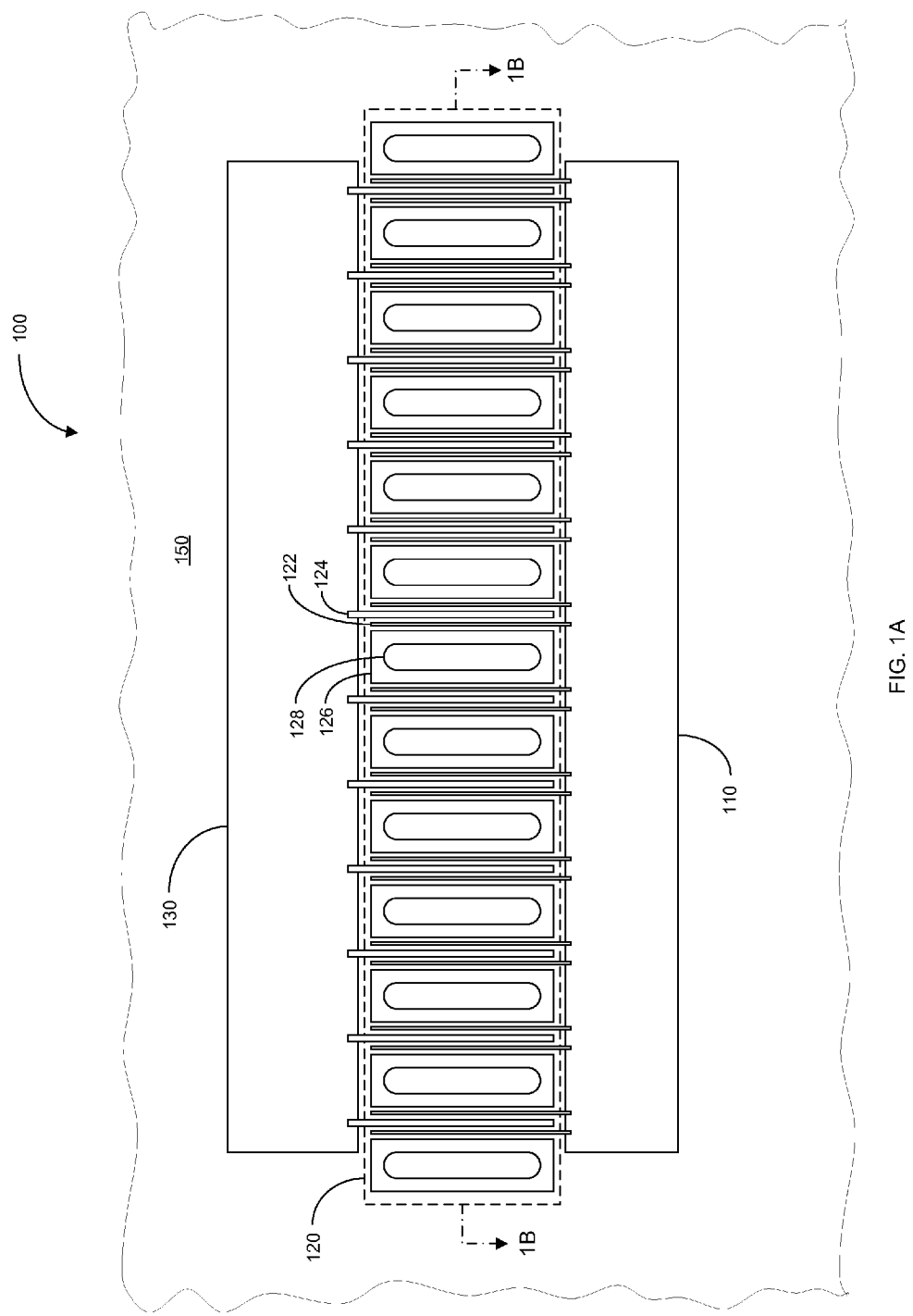
FIG. 1A illustrates a top view of an exemplary RF power transistor in accordance with an aspect of the disclosure.

FIG. 1A illustrates a top view of an exemplary RF power transistor 100 in accordance with an aspect of the disclosure. In summary, the RF power transistor, which could be a field effect transistor (FET) or high electron mobility transistor (HEMT), includes an electrically-conductive shallow trench and an electrically-conductive substrate in order to RF ground at least one terminal (e.g., a source) of the transistor. This has the effect of providing the RF ground closer to the active area of the transistor in order to reduce the parasitic inductance and resistance associated with grounding the terminal. This results in potentially higher gain, higher saturation point, higher $3^{rd}$-order intercept, more efficient combining of the input RF signal, and more efficient extraction of the output RF signal. Additional benefits include reduced process complexity, such as, for example, reduced need for plated air bridges, via holes formation and plating, front and back lithography alignment.

In particular, the transistor 100 is formed on an electrically-conductive substrate 150. For example, the electrically conductive substrate 150 has a relatively low resistivity, such as, for example, 0.1 ohm-centimeter (ohm-cm) or less. The substrate 150 may be comprised of any number of distinct materials, such as silicon (Si), silicon-carbide (SiC), stand-alone gallium-nitride (GaN), monocrystalline or polycrystalline Si or SiC, gallium-nitride (GaN), gallium-arsenide (GaAs), silicon-germanium (SiGe), silicon-on-insulator (SOI), diamond, and others.

The substrate 150 may have any thickness to ensure a desired performance of the transistor depending on the application. For example, for certain applications, the thickness of the substrate 150 may range from about 100 micrometers (μm) to 625 μm. As an example, for a four-inch wafer, the substrate 150 may have a thickness of about 525 μm; and for a six-inch wafer, the substrate 150 may have a thickness of about 625 μm.

The substrate 150 may have one or more epitaxial layers grown on its top surface. As an example, the epitaxial layers may comprise, in an ascending order above the substrate 150, (1) a nucleation layer of aluminum-nitride (AlN) followed by a transition layer comprising a GaN/AlN multilayer super lattice; (2) a GaN buffer layer; (3) an AlGaN barrier layer; and (4) a final GaN cap layer. In other words, the epitaxial layers may be nitride-based. In some designs, additional one or more layers of indium nitride (InN) may be included in the transition, buffer, barrier and cap layers. The thickness of the epitaxial layer is small compared to that of the substrate 150, and may be about 5 μm or less.

The transistor 100 further comprises an input metallization layer 110 disposed on the top surface of the top epitaxial layer. The input metallization layer 110 is adapted to receive an input RF signal for processing (e.g., amplifying) by the transistor 100. The transistor 100 further comprises an output metallization layer 130 disposed on the top surface of the top epitaxial layer. The output metallization layer 130 is adapted to produced an output RF signal processed (e.g., amplified) by the transistor 100.

The transistor 100 further comprises an active area 120, which performs the processing (e.g., amplifying) of the input RF signal in order to generate the output RF signal. In this example, the transistor 100 is configured for power amplification of the input RF signal. Accordingly, the active area 120 comprises a plurality of cells coupled in parallel, wherein each cell is adapted to perform a processing (e.g., amplification) of a portion of the input RF signal. Each cell of the active area 120 comprises an elongated source electrode 126, an elongated drain electrode 124, and an elongated gate electrode 122 situated between the source and drain electrodes, all of which are oriented substantially parallel to each other along their longitudinal axes. As illustrated, the source electrode 126 of one cell may also serve as the source electrode for an adjacent cell. Similarly, the drain electrode of one cell may also serve as the drain electrode for an adjacent cell.

The input metallization pad 110 is electrically coupled to the gate electrode 122 of each cell of the active area 120. Similarly, the drain electrode 124 of each cell is electrically coupled to the output metallization pad 130 and extends longitudinally into the active area 120 therefrom.

The source electrode 126 are electrically coupled to a grounded metallization layer (not shown in FIG. 1A) disposed on the underside of the substrate 150. To effectuate the electrical connection, an electrically-conductive shallow trench 128 is formed within the source electrode 126 of each cell. The electrically-conductive shallow trench 128 electrically couples the corresponding source electrode 126 to the underside grounded metallization layer via the electrically-conductive substrate 150. If the substrate 150 is completely electrically conductive from top to bottom, the shallow trench 128 extends all the way to the top of the substrate 150. If, on the other hand, the substrate 150 includes a thin upper portion that is electrically non-conductive, and a thick lower portion that is electrically conductive, the shallow trench 128 extends through the one or more epitaxial layers and the electrically non-conductive portion to the electrically-conductive portion of the substrate. As illustrated, the shallow trench 128 may be configured to extend longitudinally within the corresponding source electrode 126 substantially the full length of the source.

Figure 1B:
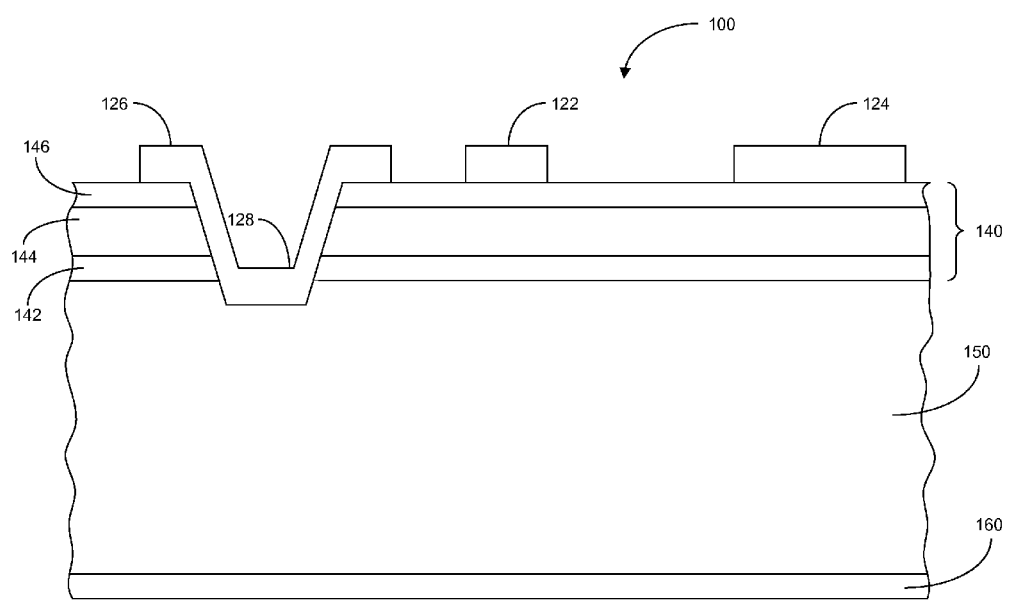
FIG. 1B illustrates a cross-sectional view of a variation of the exemplary RF power transistor in accordance with another aspect of the disclosure.

FIG. 1B illustrates a cross-sectional view of a variation of the exemplary RF power transistor 100 in accordance with another aspect of the disclosure. In this case, the electrical conductivity of the substrate 150 is substantially uniform from top to bottom and is substantially high (e.g., about 0.1 ohm-cm or less). Accordingly, the electrically-conductive shallow trench extends from the source electrode to proximate the top surface of the electrically-conductive substrate.

In particular, the transistor 100 comprises a metallization layer 160 disposed on the underside of the electrically-conductive substrate 150. The purpose of the metallization layer 160 is to provide ground potential to the transistor 100. As previously discussed, one or more epitaxial layers 140 are formed on the top surface of the electrically-conductive substrate 150. For example, the epitaxial layers 140 may comprise a transition layer 142 disposed over the top surface of the substrate 150, a buffer layer 144 disposed over the transition layer 142, and a barrier layer 146 disposed over the buffer layer 144. Although not shown, a cap layer may be formed over the barrier layer 146.

As previously discussed, the transistor 100 comprises the drain electrode 124 disposed over the barrier layer 146. Similarly, the transistor 100 also comprises the gate electrode 122 disposed over the barrier layer 146, although a gate insulation layer (not shown) may be interposed between at least a portion of the gate electrode 122 and the barrier layer 146. For example, the gate insulation layer may comprise silicon nitride ($Si_3N_4$), silicon dioxide ($SiO_2$), aluminum nitride (AlN), alumina ($Al_2O_3$), or other insulating material. Also, as previously discussed, the transistor 100 also comprises the source electrode 126, which includes an electrically-conductive shallow trench 128 that extends through the epitaxial layers 140 to the electrically-conductive substrate 150. In this configuration, the effective RF ground is substantially at the top of the substrate 150, which really brings it very close to the active area (e.g., within ~5 µm or less).

Figure 1C:
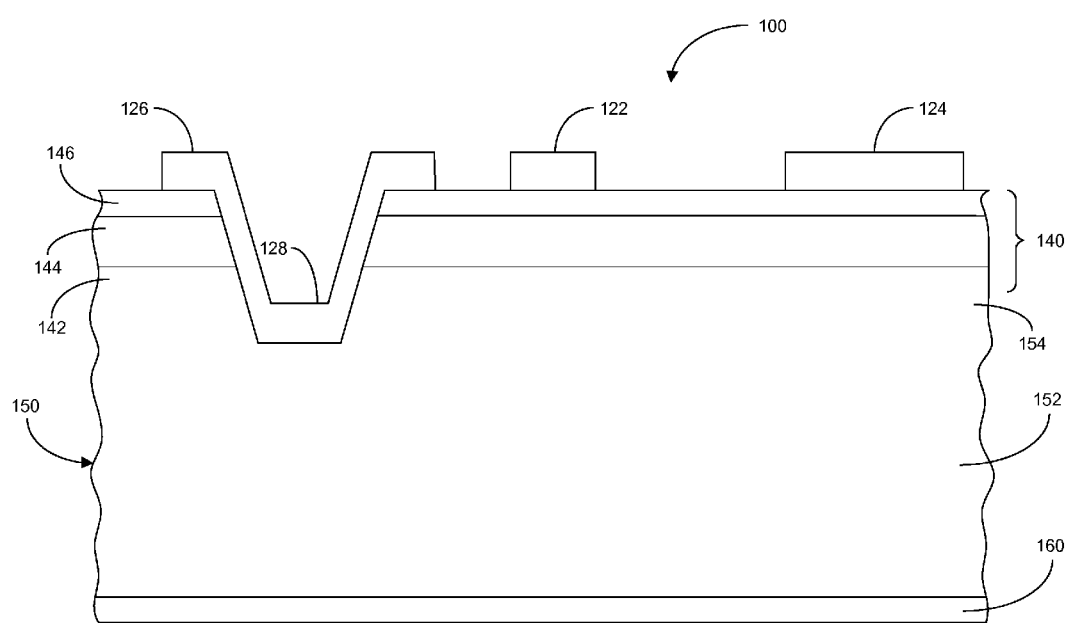
FIG. 1C illustrates a cross-sectional view of another variation of the exemplary RF power transistor in accordance with another aspect of the disclosure.

FIG. 1C illustrates a cross-sectional view of another variation of the exemplary RF power transistor 100 in accordance with another aspect of the disclosure. This transistor variation is similar to that of FIG. 1B, except that the substrate 150 includes a lower portion 152 that has a relatively high electrical conductivity and an upper portion 154 (e.g., Si epi for a Si substrate) that has a relatively low electrical conductivity. Accordingly, the electrically-conductive shallow trench 128 extends from the source electrode 126 through the epitaxial layers 140 and through the upper low conductivity portion 154 to the high conductivity portion 152 of the substrate 150. In some applications, the relatively low electrically conductive upper portion 154 of the substrate 150 may serve to reduce the capacitance between the gate and drain electrodes and the substrate 150.

Figure 2:
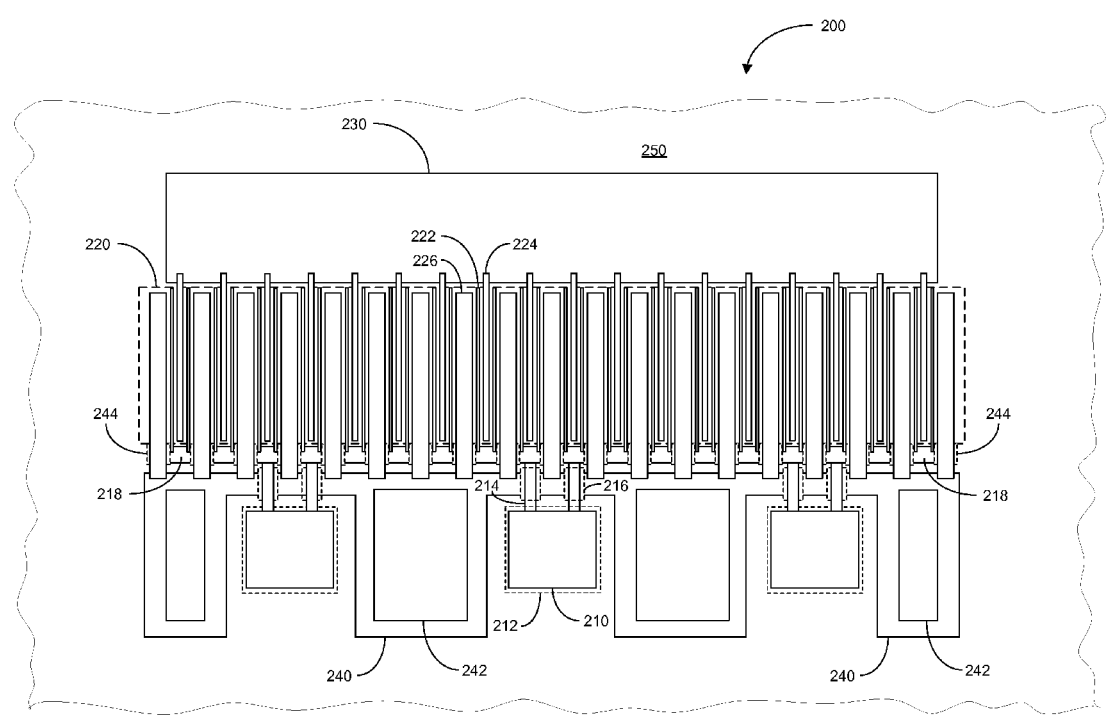
FIG. 2 illustrates a top view of another exemplary RF power transistor in accordance with another aspect of the disclosure.

FIG. 2 illustrates a top view of another exemplary RF power transistor 200 in accordance with another aspect of the disclosure. In summary, the transistor 200 comprises an electrically-conductive shallow trench and an electrically-conductive substrate to effectuate an RF grounding of at least one terminal (e.g., the source) of the transistor. In this case, however, the electrically-conductive shallow trench is situated outside of the active area of the transistor.

In particular, the transistor 200 comprises an electrically-conductive substrate 250, which may be similar to that of substrate 150 of the previous embodiments, and may include one or more epitaxial layers disposed upon its top surface. The transistor 200 further comprises one or more input metallization pads 210 for receiving an input RF signal. The metallization pads 210 may be disposed over the substrate 250 by way of an underlying insulating layer 212. The transistor 200 further comprises one or more grounded metallization pads 240 comprising one or more electrically-conductive shallow trenches 242. Via the electrically-conductive substrate 250, the electrically-conductive shallow trenches 242 are electrically coupled to a grounded metallization layer disposed on the underside of the substrate. The transistor 200 further comprises an output metallization pad 230 for producing an output RF signal. The pad 230 may be disposed over the substrate 250.

The transistor 200 further comprises an active area 220, which performs the processing (e.g., amplifying) of the input RF signal in order to generate the output RF signal. In this example, the transistor 200 is configured for power amplification of the input RF signal. Accordingly, the active area 220 comprises a plurality of cells coupled in parallel, wherein each cell is adapted to perform a processing (e.g., amplification) of a portion of the input RF signal. Each cell of the active area 220 comprises an elongated source electrode 226, an elongated drain electrode 224, and an elongated gate electrode 222 situated between the source and drain electrodes, all of which are oriented substantially parallel to each other along their longitudinal axes. As illustrated, the source electrode 226 of one cell may also serve as the source electrode for an adjacent cell. Similarly, the drain electrode of one cell may also serve as the drain electrode for an adjacent cell.

The input metallization pads 210 are electrically coupled to the gate electrode 222 of each cell of the active area 220. To effectuate this electrical connection, the transistor 200 may comprise a gate bus metallization layer 218 disposed over the substrate 250. Additionally, a plurality of metal runners or air bridges 214 electrically couple the input metallization pads 210 to the gate bus metallization layer 218. Appropriate insulating material 216 may be deposited over the substrate 250 to electrically isolate the electrical connections 214 from the source metallization pad 240. The gate electrode 222 of each cell is electrically coupled to the gate bus metallization layer 218 and extends longitudinally into the active area 220 therefrom. It shall be understood that the gate electrodes 222 may electrically connect directly to the input metallization pad 210 without the need of the metal runners or air bridges 214. Similarly, the drain electrode 224 of each cell is electrically coupled to the output metallization pad 230 and extends longitudinally into the active area 220 therefrom.

The source electrode 226 are electrically coupled to the source metallization pad 240 which, as previously discussed, is coupled to the grounded metallization layer on the underside of the substrate 250 via one or more electrically-conductive shallow trenches 242. Appropriate insulating material 244 may be deposited over the substrate 250 to electrically isolate the source electrodes 226 from the gate bus metallization layer 218.

Figure 3A:
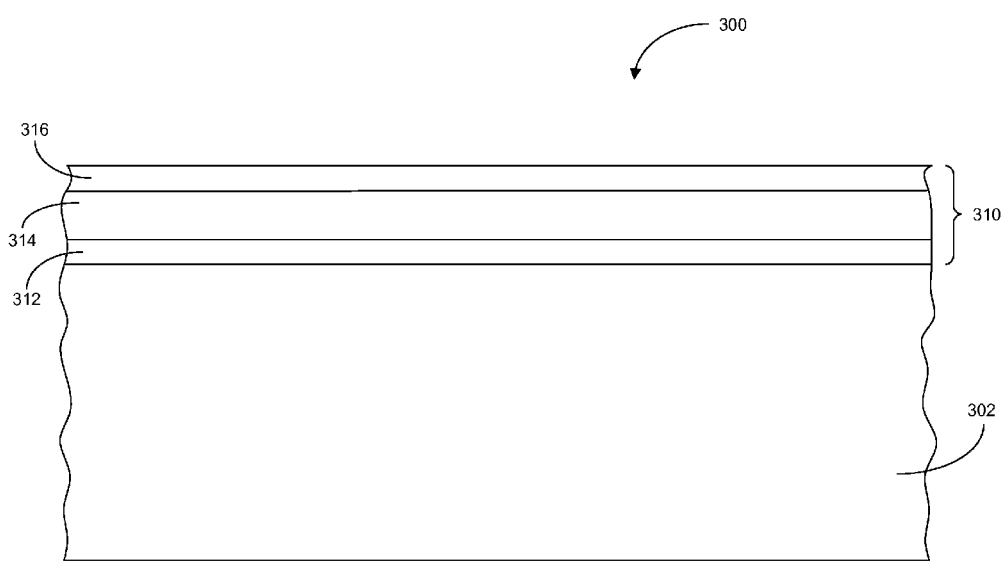
FIGS. 3A-3F illustrate cross-sectional views of an exemplary RF power transistor at various manufacturing stages in accordance with another aspect of the disclosure.

FIG. 3A illustrates a cross-sectional view of an exemplary RF power transistor 300 at an early manufacturing stage in accordance with another aspect of the disclosure. At this stage, the "transistor" 300 is merely a wafer comprising an electrically-conductive substrate 302 and one or more epitaxial layers 310 formed on the top surface of the substrate. As previously discussed, the one or more epitaxial layers 310 may include a transition layer 312 (e.g., AlN/GaN) disposed over the top surface of the substrate 302, a buffer layer 314 (e.g., GaN) disposed over the transition layer 312, and a barrier layer 316 (e.g., AlGaN) disposed over the buffer layer 314. Although not shown, a thin cap layer (e.g., GaN) may be disposed over the barrier layer 316.

Figure 3B:
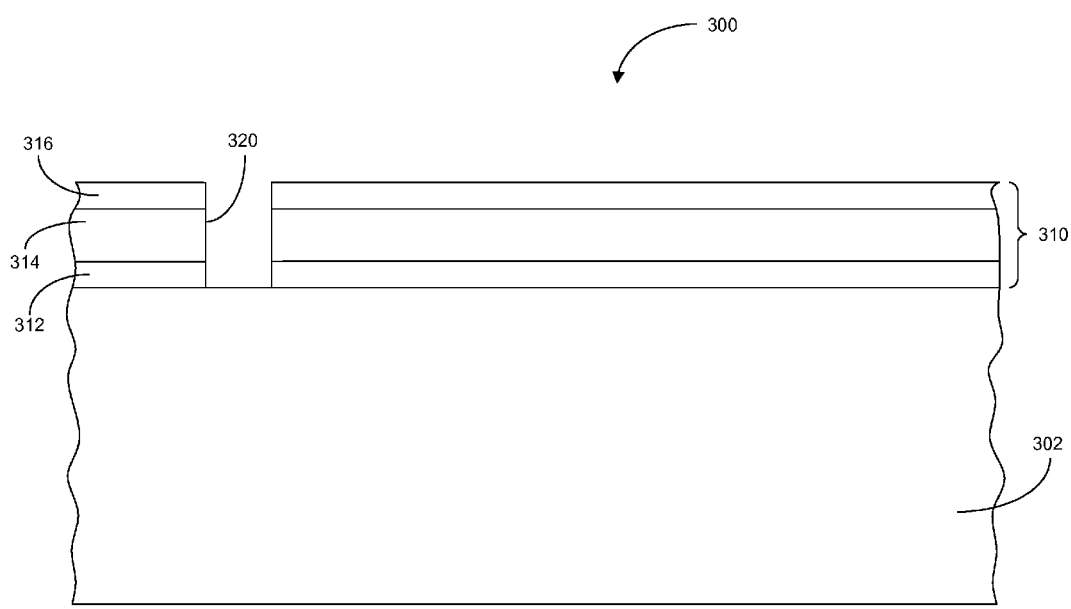

FIG. 3B illustrates a cross-sectional view of an exemplary RF power transistor 300 at a subsequent manufacturing stage in accordance with another aspect of the disclosure. At this stage, a trench 320 is formed through the epitaxial layers 310 to expose the top surface of the electrically-conductive substrate 302. As an example, the trench 320 may be formed by performing a reactive ion etching using chlorine gas chemistry on the nitride-based epitaxial layers 310. Alternatively, if the substrate 302 includes an upper layer (e.g., an epi layer) of lower electrical conductivity, the trench 320 may further extend through this upper layer and into the electrically-conductive lower portion of the substrate.

Figure 3C:
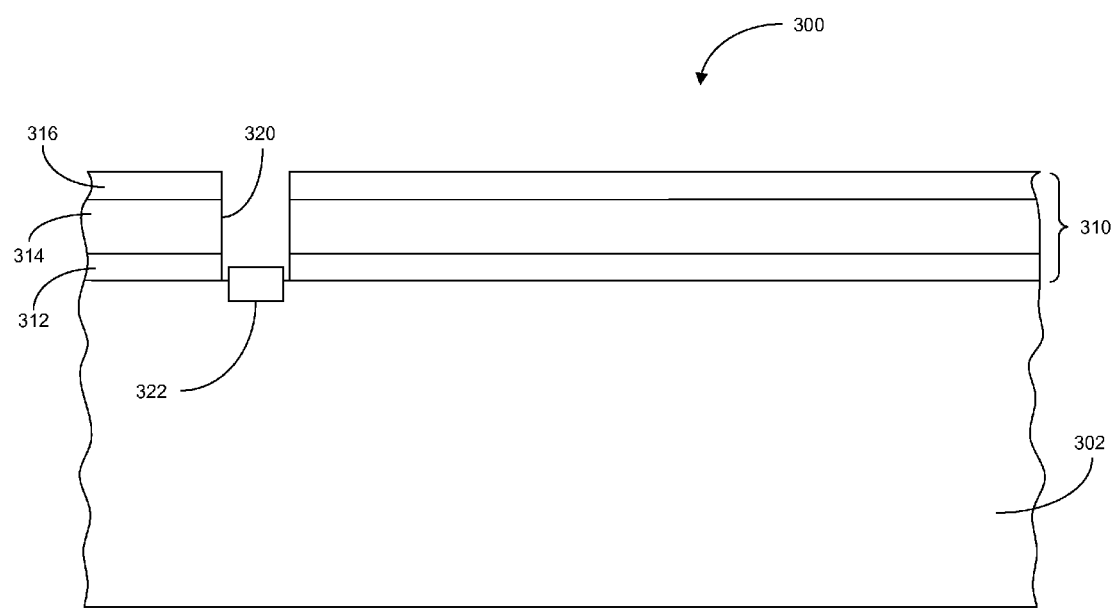

FIG. 3C illustrates a cross-sectional view of an exemplary RF power transistor 300 at another subsequent manufacturing stage in accordance with another aspect of the disclosure. At this stage, an ohmic contact 322 to the top surface of the electrically-conductive substrate 302 is formed proximate the bottom of the trench 320. As an example, Ti may be deposited followed by an annealing step at approximately 600° C. for about one minute in a nitrogen gas ($N_2$) environment to form $TiSi_2$ and TiN. To further reduce the resistance of the ohmic contact 322, a follow up step may entail sintering at 800° C. for approximately one minute in argon (Ar) environment. It shall be understood that other metals may be used to form the ohmic contact 322, such as Al, Au, etc.

Figure 3D:
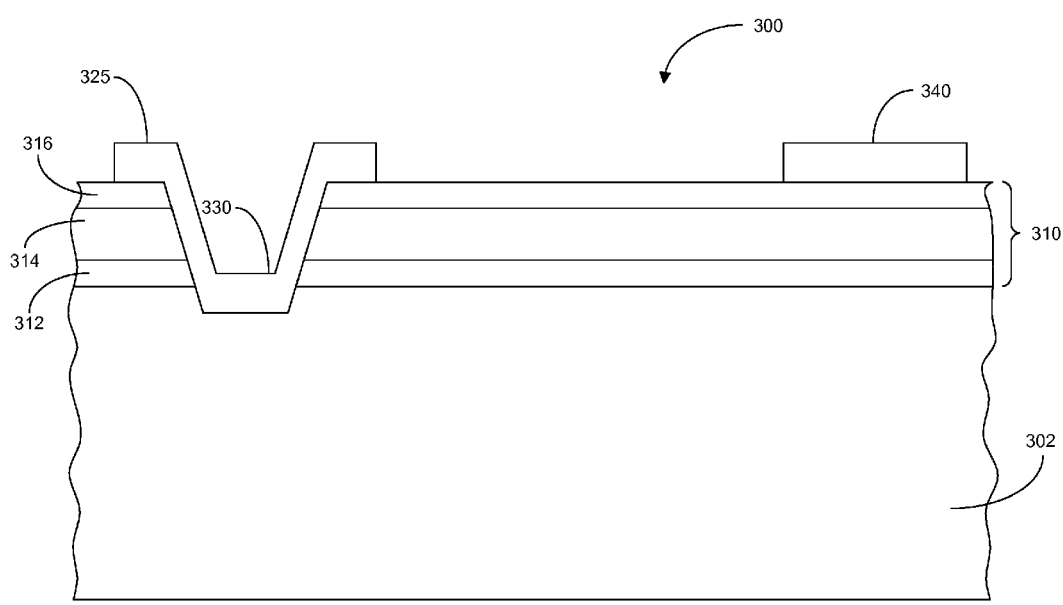

FIG. 3D illustrates a cross-sectional view of an exemplary RF power transistor 300 at another subsequent manufacturing stage in accordance with another aspect of the disclosure. At this stage, the source electrode 325 including a shallow trench metallization 330 and the drain electrode 340 are formed over the substrate 302. As an example, a multilayer stack of titanium-aluminum-nickel-gold (Ti/Al/Ni/Au) may be deposited and sintered at approximately 900° C. for about 30 seconds to form the source electrode 325, drain electrode 340, and the shallow trench conductor 330. As another example, Ti/Al is deposited and sintered at approximately 550° C. for a few minutes.

Figure 3E:
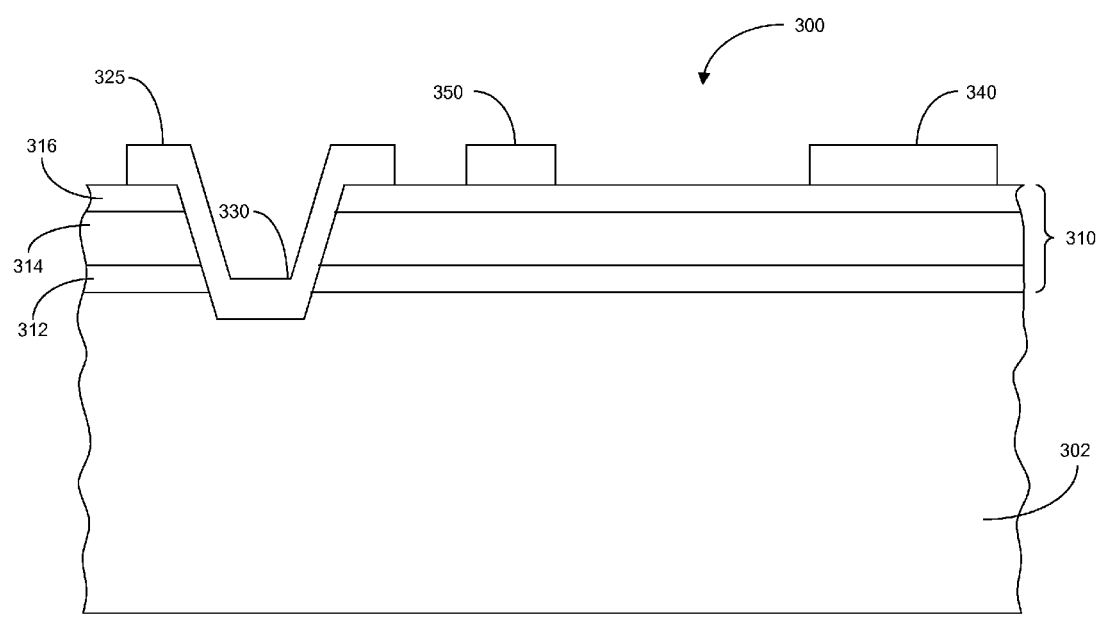

FIG. 3E illustrates a cross-sectional view of an exemplary RF power transistor 300 at another subsequent manufacturing stage in accordance with another aspect of the disclosure. At this stage, the gate electrode 350 is formed over the substrate 350. Although not shown, a gate isolation material may be formed at least partially between the gate electrode 350 and the epitaxial layers 310. For example, the gate isolation material may comprise silicon-nitride ($Si_3N_4$), silicon-dioxide ($SiO_2$), aluminum-nitride (AlN), alumina ($Al_2O_3$), or other dielectrics. The gate electrode 350 may be formed by either gate metal deposition (Ni/Au, Pt/Au, etc.) before insulator deposition, or after a silicon nitride layer has been deposited for passivation followed by gate contact etch and gate metal (Ni/Au, Pt/Au, etc.) deposition.

Figure 3F:
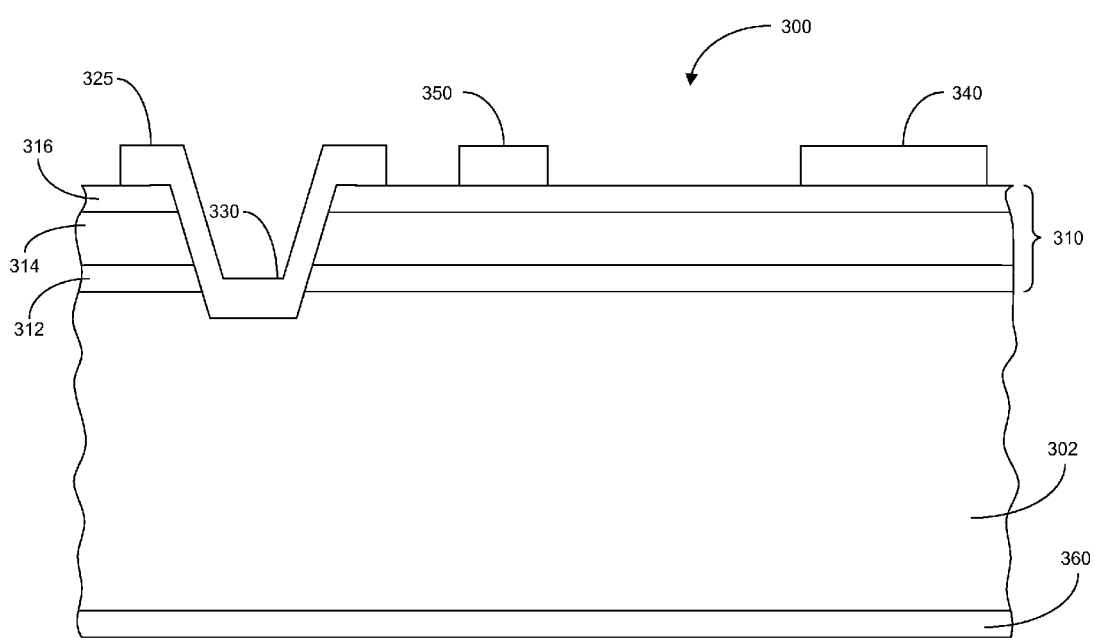

FIG. 3F illustrates a cross-sectional view of an exemplary RF power transistor 300 at another subsequent manufacturing stage in accordance with another aspect of the disclosure. At this stage, the substrate 302 may be thinned to a desired thickness and a metallization layer 360 is formed on the underside of the substrate 302. The device 300 may then be soldered onto a metal flange of a plastic or ceramic packaging. The metal flange may serve as a heat sink for the device 300.

It shall be understood that the RF power transistor 300 need not be manufactured in the order described. For example, the forming of the trench 320 and the ohmic contact 322 may be performed after the formation of the source and drain electrodes 325 and 340, but before the formation of the gate electrode 350. Alternatively, the forming of the trench 320 and the ohmic contact 322 may be performed after the formation of the source, drain and gate electrodes 325, 340 and 350. Additionally, the electrical connection 330 of the source electrode 325 to the substrate 302 may be performed after the formation of the gate electrode 350. Other step orders may be implemented in the manufacturing of the RF power transistor.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. A transistor, comprising:
   an electrically-conductive substrate;
   a grounding metallization layer disposed on a bottom surface of the electrically-conductive substrate;
   a first transistor electrode disposed over a top surface of the electrically-conductive substrate;
   an electrically-conductive shallow trench electrically connecting the first transistor electrode to the grounding metallization layer by way of the electrically-conductive substrate; and
   one or more stacked epitaxial layers disposed over the electrically-conductive substrate, wherein the first transistor electrode is disposed over the one or more stacked epitaxial layers, wherein the electrically-conductive substrate comprises a lower portion of relatively high electrical conductivity and an upper portion of relatively low electrical conductivity, and wherein the electrically-conductive shallow trench extends through the one or more stacked epitaxial layers and through the upper portion to the lower portion of the substrate.

2. The transistor of claim 1, wherein the electrically-conductive shallow trench is situated within an active area of the transistor.

3. The transistor of claim 1, wherein the electrically-conductive shallow trench is situated external to an active area of the transistor.

4. The transistor of claim 1, wherein the first transistor electrode comprises a source electrode, and further comprising gate and drain electrodes formed over the electrically-conductive substrate.

5. The transistor of claim 1, wherein the electrically-conductive substrate comprises silicon (Si), silicon-carbide (SiC) or stand-alone gallium-nitride (GaN).

6. A field effect transistor (FET), comprising:
   an electrically-conductive substrate;
   a grounding metallization layer disposed on a bottom surface of the electrically-conductive substrate;
   an active area comprising at least one cell including source, gate and drain electrodes disposed over a top surface of the electrically-conductive substrate, wherein the gate electrode is interposed between the source and drain electrodes;
   an electrically-conductive shallow trench electrically connecting the source electrode to the grounding metallization layer by way of the electrically-conductive substrate; and
   one or more stacked epitaxial layers disposed over the electrically-conductive substrate, wherein the source, gate and drain electrodes are disposed over the one or more stacked epitaxial layers, wherein the electrically-conductive substrate comprises a lower portion of relatively high electrical conductivity and an upper portion of relatively low electrical conductivity, and wherein the electrically-conductive shallow trench extends through the one or more stacked epitaxial layers and through the upper portion to the lower portion of the substrate.

7. The FET of claim 6, wherein the one or more stacked epitaxial layers comprises:
a transition layer disposed over the top surface of the electrically-conductive substrate;
a buffer layer disposed over the transition layer; and
a barrier layer disposed over the buffer layer.

8. The FET of claim 6, wherein the electrically-conductive shallow trench is situated within the active area.

9. The FET of claim 6, wherein the electrically-conductive shallow trench is situated external to the active area.

10. The FET of claim 6, wherein the active area comprises a plurality of said cell coupled in parallel.

11. The FET of claim 10, wherein at least one pair of adjacent cells share one source electrode, and at least another pair of adjacent cells share one drain electrode.

12. A field effect transistor (FET), comprising:
an electrically-conductive substrate;
a grounding metallization layer disposed on a bottom surface of the electrically-conductive substrate;
an active area comprising at least one cell including source, gate and drain electrodes disposed over a top surface of the electrically-conductive substrate, wherein the gate electrode is interposed between the source and drain electrodes;
an electrically-conductive shallow trench electrically connecting the source electrode to the grounding metallization layer by way of the electrically-conductive substrate;
one or more stacked epitaxial layers disposed over the electrically-conductive substrate, wherein the source, gate and drain electrodes are disposed over the one or more stacked epitaxial layers, and wherein the one or more stacked epitaxial layers comprises:
a transition layer disposed over the top surface of the electrically-conductive substrate;
a buffer layer disposed over the transition layer; and
a barrier layer disposed over the buffer layer; and
a cap layer disposed over the barrier layer.

13. The FET of claim 12,
wherein the transition layer comprises a GaN/AlN multilayer super lattice;
wherein the buffer layer comprises a GaN buffer layer;
wherein the barrier layer comprises an AlGaN barrier layer; and
wherein the cap layer comprises a GaN cap layer.

14. The transistor of claim 13, wherein the electrically-conductive substrate comprises silicon (Si), silicon-carbide (SiC) or stand-alone gallium-nitride (GaN).

15. A field effect transistor (FET), comprising:
an electrically-conductive substrate;
a grounding metallization layer disposed on a bottom surface of the electrically-conductive substrate;
an active area comprising a plurality of cells coupled in parallel, wherein at least one of the cells comprises source, gate and drain electrodes disposed over a top surface of the electrically-conductive substrate, and wherein the gate electrode is interposed between the source and drain electrodes;
an electrically-conductive shallow trench electrically connecting the source electrode to the grounding metallization layer by way of the electrically-conductive substrate;
an input metallization pad disposed over the electrically-conductive substrate and adapted to receive an input RF signal, wherein the input metallization pad is electrically coupled to the gate electrode of each cell; and
an output metallization pad disposed over the electrically-conductive substrate and adapted to produce an output RF signal, wherein the output metallization pad is electrically coupled to the drain electrode of each cell.

16. A method of forming a transistor, comprising:
forming a grounding metallization layer on a bottom surface of an electrically-conductive substrate;
forming a transistor electrode over a top surface of the electrically-conductive substrate; and
forming an electrically-conductive shallow trench for electrically connecting the transistor electrode to the grounding metallization layer by way of the electrically-conductive substrate;
forming one or more stacked epitaxial layers disposed over the electrically-conductive substrate, wherein the transistor electrode is disposed over the one or more stacked epitaxial layers, wherein the electrically-conductive substrate comprises a lower portion of relatively high electrical conductivity and an upper portion of relatively low electrical conductivity, and wherein the electrically-conductive shallow trench extends through the one or more stacked epitaxial layers and through the upper portion to the lower portion of the substrate.

* * * * *